(12) United States Patent
Wiegert

(10) Patent No.: US 7,932,718 B1
(45) Date of Patent: Apr. 26, 2011

(54) SYSTEM AND METHOD USING MAGNETIC ANOMALY FIELD MAGNITUDES FOR DETECTION, LOCALIZATION, CLASSIFICATION AND TRACKING OF MAGNETIC OBJECTS

(75) Inventor: Roy Wiegert, Panama City Beach, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 219 days.

(21) Appl. No.: 12/383,083

(22) Filed: Mar. 12, 2009

(51) Int. Cl.
*G01R 33/02* (2006.01)
*G01V 3/08* (2006.01)

(52) U.S. Cl. ........................ 324/247; 324/245

(58) Field of Classification Search ............. 324/207.11, 324/244–245, 247, 260, 326; 33/355 R
See application file for complete search history.

(56) References Cited

U.S. PATENT DOCUMENTS 7,038,458 B1 * 5/2006 Wiegert ........................ 324/345
7,342,399 B1 * 3/2008 Wiegert ........................ 324/326

* cited by examiner

*Primary Examiner* — Bot L LeDynh
(74) *Attorney, Agent, or Firm* — James T. Shepherd

(57) ABSTRACT

A magnetic anomaly sensing system and method uses at least four triaxial magnetometer (TM) sensors with each of the TM sensors having X,Y,Z magnetic sensing axes. The TM sensors are arranged in a three-dimensional array with respective ones of the X,Y,Z magnetic sensing axes being mutually parallel to one another. The three-dimensional array defines a geometry that forms at least one single-axis gradiometer along each of the X,Y,Z magnetic sensing axes. Information sensed by the TM sensors is to generate scalar magnitudes of a magnetic anomaly field measured at each of the TM sensors, comparisons of the scalar magnitudes to at least one threshold value, distance to a source of the magnetic anomaly field using the scalar magnitudes when the threshold value(s) is exceeded, and a magnetic dipole moment of the source using the distance.

23 Claims, 9 Drawing Sheets

SYSTEM AND METHOD USING MAGNETIC ANOMALY FIELD MAGNITUDES FOR DETECTION, LOCALIZATION, CLASSIFICATION AND TRACKING OF MAGNETIC OBJECTS

ORIGIN OF THE INVENTION

The invention described herein was made in the performance of official duties by an employee of the Department of the Navy and may be manufactured, used, licensed by or for the Government for any governmental purpose without payment of any royalties thereon.

FIELD OF THE INVENTION

The invention relates generally to magnetic sensing systems, and more particularly to a stationary magnetic anomaly sensing system and method that uses scalar magnitudes of magnetic anomaly fields in the detection, localization, classification and/or tracking of a moving magnetic object(s).

BACKGROUND OF THE INVENTION

There are many potential military and commercial applications for an improved (i.e., longer-range and more economical) passive magnetic sensing system that can detect, track and measure the DC magnetic anomaly fields of moving magnetic objects or "targets" in real-time. The word "passive" indicates that the magnetic sensing system does not produce magnetic anomaly fields but only detects (and processes) the magnetic anomaly field that emanates from a target's inherent magnetic signature. The magnetic signatures stem from ferrous materials that are contained in the physical structure of a target.

Targets of interest that produce detectable magnetic signatures include watercraft such as naval vessels, and land vehicles such as cars, trucks or military tanks. Frequently, the presence, location, state of motion, and magnetic signature of these targets must be determined. Different types of targets typically will have different magnetic signatures that can be correlated with the target's ferrous structure. Thus, measurements of a target's magnetic signature can be used to classify the target. However, the physical nature of magnetic anomaly fields (i.e., a rapid reduction in magnetic field strength with distance) has limited the effective range of current magnetic anomaly sensing-based systems.

Currently, point-by-point "detection, localization and classification" (DLC) of magnetic objects generally requires a number of vector magnetic sensors that are configured as magnetic gradiometers. A gradiometer measures magnetic gradients, i.e., the rates of change of magnetic fields with distance. It is known in the art that passive magnetic detection and ranging of moving targets can be achieved by using a stationary magnetic sensing system having a combination gradiometer/magnetometer that measures five independent gradient tensor components and at least one vector field component of the target's magnetic anomaly field. However, because of the limitations of conventional prior art approaches with regard to their sensing system embodiments and signal processing methods, they have not produced a practical long-range DLC and/or tracking system.

Recently, U.S. Pat. No. 7,342,399 (i.e., "the '399 patent" as it also will be referred to hereinafter) disclosed a novel gradiometer-based system for tracking a magnetic object. The '399 patent teaches an improved magnetic anomaly sensing-based system for tracking and classifying magnetic objects. In particular, the '399 patent describes a magnetic anomaly gradient sensing system based on the teachings in U.S. Pat. Nos. 6,476,610 and 6,841,994.

U.S. Pat. No. 6,476,610 (i.e., "the '610 patent" as it will also be referred to hereinafter) disclosed a novel magnetic gradiometer and signal processing concept denoted as "Scalar Triangulation and Ranging" (STAR) for target localization from maneuverable sensing platforms. The prior art STAR concept uses unique, rotationally invariant scalar "contractions" of magnetic gradient tensor components to "triangulate" relative distances to a target. Within the target-detection distance of a STAR-type gradiometer, the scalar triangulation process does not directly depend on the target's magnetic dipole signature. Thus, a STAR-type sensing technology can track a magnetic target even as its magnetic signature changes due to the target's motion in the Earth's magnetic field.

U.S. Pat. No. 6,841,994 (i.e., "the '994 patent" as it will also be referred to hereinafter) disclosed significant improvements to the STAR gradiometer design and method that better determine the range, relative bearing and magnetic signature of a stationary target from a mobile sensing platform. The '399 patent discloses a unique application of the '994 patent's magnetic gradient based STAR method that can be used to detect a moving magnetic object, and accurately determine the object's position and changes in its position, velocity and magnetic moment signature while compensating for the aspherical nature of the magnetic object's gradient contraction contours. The '399 patent also discloses a magnetic anomaly sensing system that can be used to remotely align or point an external device or system at a moving magnetic object. Thus, the '399 patent disclosed an improved magnetic gradient sensing based STAR technology that can overcome the limitations of prior art technologies and detect, track and measure the DC magnetic anomaly fields of moving magnetic objects or "targets" in real-time.

The tracking technology disclosed in the '399 patent is a relatively short-range technology because it uses magnetic gradient based methods to track and classify magnetic targets. Note that all magnetic gradiometer based sensing systems are relatively short-range systems since magnetic gradient signals are proportional to the inverse fourth power of distance from a target and very rapidly decrease to a sensor system's noise level as sensor-to-target distance increases. In addition, STAR gradiometer-based sensing systems generally require seven or eight "triaxial magnetometer" (TM) type vector magnetic field sensing elements. While these multiple-TM arrays enhance the effectiveness of a STAR-type gradiometer, they also increase the physical size, complexity and cost of the technology and detract from its practical usage.

SUMMARY OF THE INVENTION

Accordingly, it is an object of the present invention to provide a passive magnetic anomaly sensing system and method having improved detection, classification and/or tracking range as compared to magnetic gradiometer based systems.

Another object of the present invention is to provide a longer-range magnetic anomaly sensing system that uses a simple sensor package.

Other objects and advantages of the present invention will become more obvious hereinafter in the specification and drawings.

In accordance with the present invention, a magnetic anomaly sensing system and method are provided. The approach uses at least four triaxial magnetometer (TM) sensors with each of the TM sensors having X,Y,Z magnetic sensing axes. The TM sensors are arranged in a three-dimensional array with respective ones of the X,Y,Z magnetic sensing axes being mutually parallel to one another in the three-dimensional array. The three-dimensional array defines a geometry that forms at least one single-axis gradiometer along each of the X,Y,Z magnetic sensing axes. One or more processors are coupled to the TM sensors to generate scalar magnitudes of a magnetic anomaly field measured at each of the TM sensors, comparisons of the scalar magnitudes to at least one threshold value, distance to a source of the magnetic anomaly field using the scalar magnitudes when the threshold value(s) is exceeded, and a magnetic dipole moment of the source using the distance.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Prior to describing the present invention's novel magnetic target detection using the magnitudes of a magnetic anomaly field, some technical background related to magnetic anomaly sensing will be provided below. In general, the design and operation of magnetic sensing systems for "detection, localization and classification" (DLC) of magnetically polarized objects use the following phenomena:

1. The vector magnetic fields (B) that emanate from a magnetic object's magnetic moment (i.e., magnetic signature (M)) produce relatively small, short-range "magnetic anomalies" within the Earth's magnetic background field ($B_E$). In principle, magnetic anomaly sensing systems can measure and process B-field data to detect the presence of a magnetic target, locate its position in space, and classify the target in terms of its magnetic signature M.

2. The relatively large, and locally nearly uniform (over short distances of hundreds of meters or less) magnetic induction field of Earth ($B_E$) permeates all space around the planetary surface. The $B_E$ field may induce much of an object's net magnetic signature M that is the source of an object's magnetic anomaly field B. However, the earth's magnetic field also complicates the process of DLC of magnetic objects.

Figure 1:
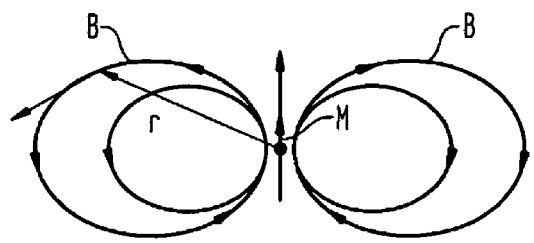
FIG. 1 is a qualitative sketch illustrating magnetic lines of force of a vector magnetic dipole field.

The present invention uses the well-known dipole equation $$B(r,M)=(\mu/4\pi)[3(M\cdot r)r/r^5-M/r^3] \quad (1a)$$

where the units of B are tesla (T), "r" is the object's location vector in meters (m), "M" its magnetic dipole moment in amperes (A) meters squared or $Am^2$, $\mu$ is the magnetic permeability of the surrounding media and is approximately equal to $4\pi\times10^{-7}$ Tm/A, and $\pi=3.14159$. FIG. 1 is a qualitative sketch showing the relation of the vector field "lines of force" of B to r and M. In order to perform point-by-point localization and classification of a magnetic dipole type target, a magnetic sensor system (or "magnetometer) must collect sufficient B-field data to determine six unknowns; namely, three vector components of target location r and three vector components of magnetic dipole moment (or "signature") M. The components of M can be used to magnetically classify the target.

In a Cartesian coordinate system with unit vectors i,j,k along the XYZ directions, the three components of B can be written in terms of the six independent scalar components of r and M ($r_X$, $r_Y$, $r_Z$ and $M_X$, $M_Y$, $M_Z$) as:

$$B_X=(\mu/4\pi)[(3r_X^2-r^2)M_X+3r_Xr_YM_Y+3r_Xr_ZM_Z]r^{-5}$$

$$B_Y=(\mu/4\pi)[3r_Xr_YM_X+(3r_Y^2-r^2)M_Y+3r_Yr_ZM_Z]r^{-5}$$

$$B_Z=(\mu/4\pi)[3r_Xr_ZM_X+3r_Yr_ZM_Y+(3r_Z^2-r^2)M_Z]r^{-5} \quad (1b)$$

Note that these equations are nonlinear with regard to components of r and linear with regard to components of M. The scalar magnitudes $B=|B|$, $r=|r|$ and $M=|M|$ are given by:

$$B=[(B_X)^2+(B_Y)^2+(B_Z)^2]^{0.5}$$

$$r=[(r_X)^2+(r_Y)^2+(r_Z)^2]^{0.5}$$

$$M=[(M_X)^2+(M_Y)^2+(M_Z)^2]^{0.5}$$

The present invention's embodiments and innovative magnetic anomaly magnitude based methods provide unique and improved capabilities for detecting, localizing, classifying and tracking moving magnetic targets. In particular, this invention provides improved target-tracking capabilities by application of the following features of the magnitude B of the magnetic anomaly field:

1. The scalar magnitude B is a rotationally invariant and robust quantity.

2. The B-field can be mathematically expressed in a form that is analogous to a central potential type scalar field. Specifically, $B=(\mu/4\pi)k_BMr^{-3}$ where $k_B$ is a dimensionless "asphericity parameter" or a number ($1 \leq k_B \leq 2$) that characterizes the B-field's departure from perfect spherical symmetry.

3. For a magnetic dipole target, contours of constant B (indicated by the dashed lines in FIG. 2A) form a family of concentric prolate spheroidal "equipotential-type" surfaces that are centered on the dipole. For a given constant B, the ratio of the spheroid's major (vertical) axis to its minor (horizontal) axis is 1.26 to 1.

As will be discussed below, these features of B are analogous to those of the "gradient contraction field" ($C_T$) disclosed in the aforementioned patents with one major difference. Namely, $B \propto 1/r^3$ while $C_T \propto 1/r^4$. Therefore, the present invention's use of magnetic anomaly magnitudes as primary DLC parameters instead of the gradient contraction type parameters used by the prior art STAR technologies increases the range of STAR technology-based target DLC and/or tracking.

As mentioned above, the Earth's field $B_E$ complicates the process of measuring the components of B due to a magnetic anomaly or target. Since a target's B field components are convolved with the Earth's main field $B_E$, a magnetic sensing system actually performs measurements of a total field ($B_T$) that is given by:

$$B_T = (B_E + B) = (B_{EX} + B_X)i + (B_{EY} + B_Y)j + (B_{EZ} + B_Z)k \quad (2)$$

The Earth's field $B_E$ makes it difficult to effectively measure/discriminate between $B_X$, $B_Y$ and $B_Z$ because:

1. At distances of a few meters from a typical target, its B-field magnitude is relatively very small (i.e., on the order of $10^{-9}$ tesla or 1 nano-tesla (nT)) or less. Thus, measurement of B-fields requires highly sensitive field-sensing instruments.
2. $B_E$ has a magnitude $B_E$ that varies from about 30,000 nT at the Earth's equator to about 60,000 nT at the Earth's poles. Thus $B_E$ is many orders of magnitude larger than a target's B, and can interfere with high sensitivity measurements of B unless the sensing system has a very high "dynamic range" (i.e., well over 100 dB) and/or provides an embodiment with means and methods to greatly reduce the effects of $B_E$.
3. Due to solar wind and other effects, the XYZ components of $B_E$ may unpredictably change by tens or hundreds of nano-tesla over time periods of minutes. These non-target-related "temporal" effects must somehow be compensated for, or they will greatly interfere with measurement of the XYZ components of B.

In order to overcome these difficulties, the present invention provides means and methods that enable accurate measurement and discrimination of very small XYZ components of B that are convolved with the relatively very large and time-dependent Earth field $B_E$. Although the invention's primary DLC modality uses B-field magnitudes, the invention also uses magnetic gradient-derived quantities to i) reduce the effects of temporal variations in the components of $B_E$, and ii) provide a complementary DLC modality.

It is generally known in the art of magnetic sensing that the spatial rate of change of $B_E$ with distance, i.e., the gradient of $B_E$ or $\nabla B_E$, is relatively very small and does not change appreciably with time. Typically, $|\nabla B_E|$ is approximately 0.02 nT/meter. Therefore, the temporal effects of $B_E$ can be greatly reduced by using sensor system embodiments that measure magnetic gradients.

The gradient of the vector field ($G = \nabla B$) is a second-rank tensor whose matrix elements are given by:

$$(\nabla B)_{ij} = G_{ij} = \partial B_i / \partial r_j$$

$$= -3(\mu/4\pi)[M \cdot r(5r_i r_j - r^2 \delta_{ij}) - r^2(r_i M_j + r_j M_i)]r^{-7} \quad (3)$$

The "i" and "j" sub indices represent XYZ components and $\delta_{ij}$ is the "Kronecker delta function". For $i=j$, $\delta_{ij}=1$; and, for $i \neq j$, $\delta_{ij}=0$. Thus, $\delta_{XX}=1$ and $\delta_{XY}=0$, etc. The scalar magnitude ($C_T$) of the magnetic gradient tensor (G) is given by the square root of the sum of squares of the tensor's components. In the aforementioned patents, the magnitude $G=|G|$ is denoted as "gradient contraction". Thus, $$C_T = [\Sigma (G_{ij})^2]^{0.5} = \quad (4)$$

$$= [(\partial B_x / \partial x)^2 + (\partial B_x / \partial y)^2 + (\partial B_x / \partial z)^2 + (\partial B_y / \partial x)^2 + (\partial B_y / \partial y)^2 + (\partial B_y / \partial z)^2 + (\partial B_z / \partial x)^2 + (\partial B_z / \partial y)^2 + (\partial B_z / \partial z)^2]^{0.5}$$

which can be approximated by the following $$[(\Delta B_x / \Delta x)^2 + (\Delta B_x / \Delta y)^2 + (\Delta B_x / \Delta z)^2 + (\Delta B_y / \Delta x)^2 + (\Delta B_y / \Delta y)^2 + (\Delta B_y / \Delta z)^2 + (\Delta B_z / \Delta x)^2 + (\Delta B_z / \Delta y)^2 + (\Delta B_z / \Delta z)^2]^{0.5}$$

As discussed in detail in the '994 and '399 patents, the contents of which are hereby incorporated by reference, the gradient-contraction-based magnetic Scalar Triangulation and Ranging (STAR) method for real-time, point-by-point DLC of magnetic targets is based on the following features of $C_T$:

1. The scalar magnitude $C_T$ is a rotationally invariant and robust quantity.
2. The $C_T$-field can be mathematically expressed in a form that is analogous to a central potential type scalar field, that is: $C_T = (\mu/4\pi) k_C M r^{-4}$ where $k_C$ is a dimensionless "asphericity parameter" or number ($4.24 \leq k_C \leq 7.15$) that characterizes the $C_T$ field's departure from perfect spherical symmetry.
3. For a magnetic dipole target, contours of constant $C_T$ form a family of concentric prolate spheroidal "equipotential-type" surfaces that are centered on the dipole. As indicated in FIG. 3, for a given contour of constant $C_T$, the ratio of the spheroid's major axis to its minor axis is $(7.15/4.24)^{0.25}$ or about 1.14 to 1.

Figure 3:
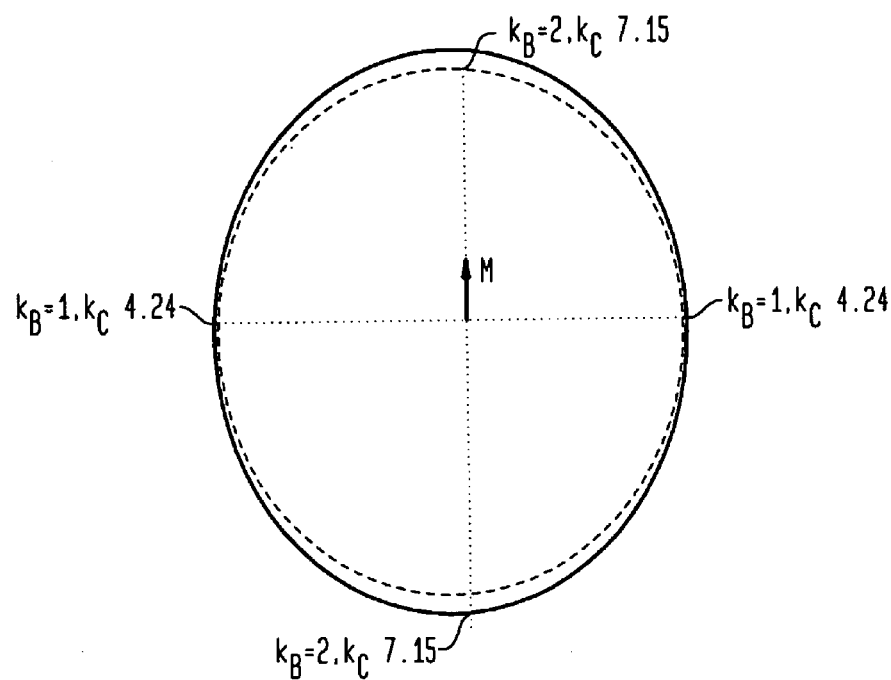
FIG. 3 is a semi-quantitative two-dimensional graphic view comparing the asphericities of a single contour of constant magnetic anomaly field magnitude and a single contour of constant magnetic gradient contraction associated with a magnetic dipole field.

FIG. 3 graphically compares the geometrical properties and asphericity parameter values of the $C_T$-field (illustrated with a dashed-line curve) to those of the B-field (illustrated by a solid-line curve). Note that the B field features discussed above are qualitatively analogous to those of the $C_T$ field that provides the basis for the STAR methods disclosed in the above-mentioned patents and patent application. Therefore, the present invention's innovative use of B-type parameters facilitates the following:

1. Application of a new, non-gradiometric Scalar Triangulation and Ranging (STAR) approach for detection, localization and classification (DLC) of magnetic targets that can apply, with appropriate modifications, the general STAR formalisms that were disclosed in the aforementioned patents.
2. Longer-range DLC and tracking of a magnetic target.
3. Simpler sensor system embodiments because only one triaxial magnetometer (TM) sensor is required to develop a three-independent-component B-type STAR parameter (or "B-STAR parameter" as it will also be referred to herein) while each $C_T$ parameter requires at least five independently measured gradient components that must be obtained from at least three (and preferably four) non collinear TM sensors. Thus, using B-type parameters allows the invention to accomplish longer-range DLC with fewer TM sensors.

Figure 2A:
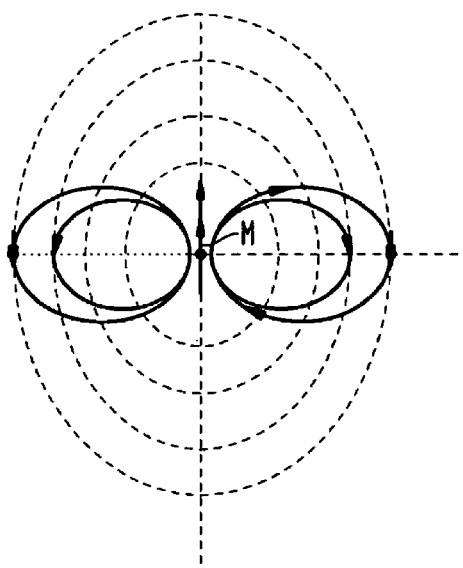
FIG. 2A is a qualitative two-dimensional graphic view of a magnetic object's magnetic dipole field and contours of constant magnetic anomaly field magnitudes associated with the magnetic dipole field.

With continuing reference to FIG. 2A, the geometrical properties of B are qualitatively illustrated where contours of constant B (represented by dashed contour lines) form concentric prolate spheroidal surfaces that enclose a source (e.g., target dipole signature M) of the magnetic anomaly field. The polar axis of the dipole field is illustrated by the vertical dotted line and the field's transverse or "equator" axis is illustrated by the horizontal dotted line. Magnetic lines of force of the dipole field are illustrated by curved solid lines.

Figure 2B:
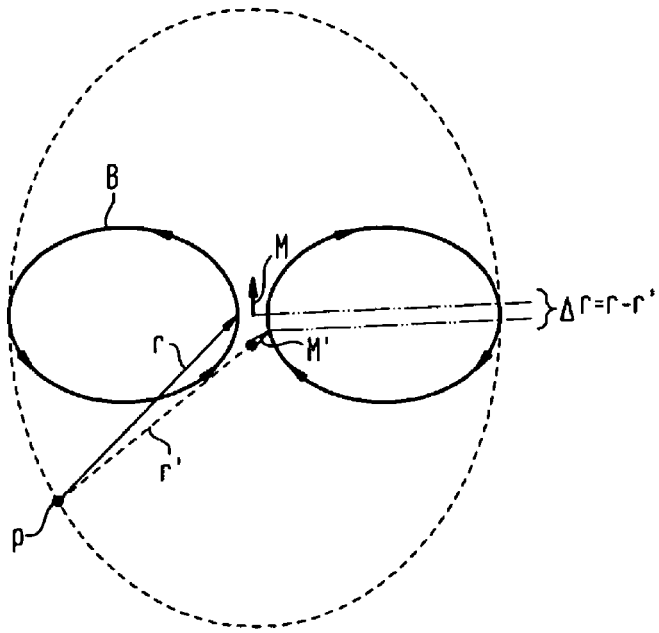
FIG. 2B is a qualitative two-dimensional graphic view of a single contour of constant magnetic anomaly field magnitude illustrating the ranging and magnetic signature measurement errors introduced by the aspherical nature of the constant magnetic anomaly field magnitude contour.

Additional reference will now be made to FIG. 2B where only one of the constant B contours is illustrated for clarity. At a given sensor-to-target distance "r", B is primarily a function of the magnetic dipole moment M of the target, distance r, and the dimensionless asphericity parameter "$k_B$". The $k_B$-parameter characterizes the variance of the B "potential field" from true spherical symmetry. Specifically, for media with constant magnetic permeability μ, $B=k_B(\mu/4\pi)M/r^3$ where calculations show that $k_B$ slowly varies from exactly 2 for points on the dipole axis to 1 for points on the equator. For contours of constant magnetic anomaly magnitude, the ratio of the diameter at dipole axis to a diameter at the equator is $(2)^{1/3}$ to 1, that is, about 1.26 to 1.

The aspherical nature of the constant B contours can cause inaccuracies or "asphericity errors" in the present invention's STAR methods similar to the inaccuracies in the $C_T$-based STAR methods that were described in the '399 patent. For example, referring again to FIG. 2B, for a magnetometer sensor position "p" located between the dipole axis and the equator, application of the invention's B-field-based STAR method will produce a measured vector position or range r' and a measured target dipole moment M' that can differ slightly from the true values of range r to target T and the dipole moment M thereof.

Figure 4:
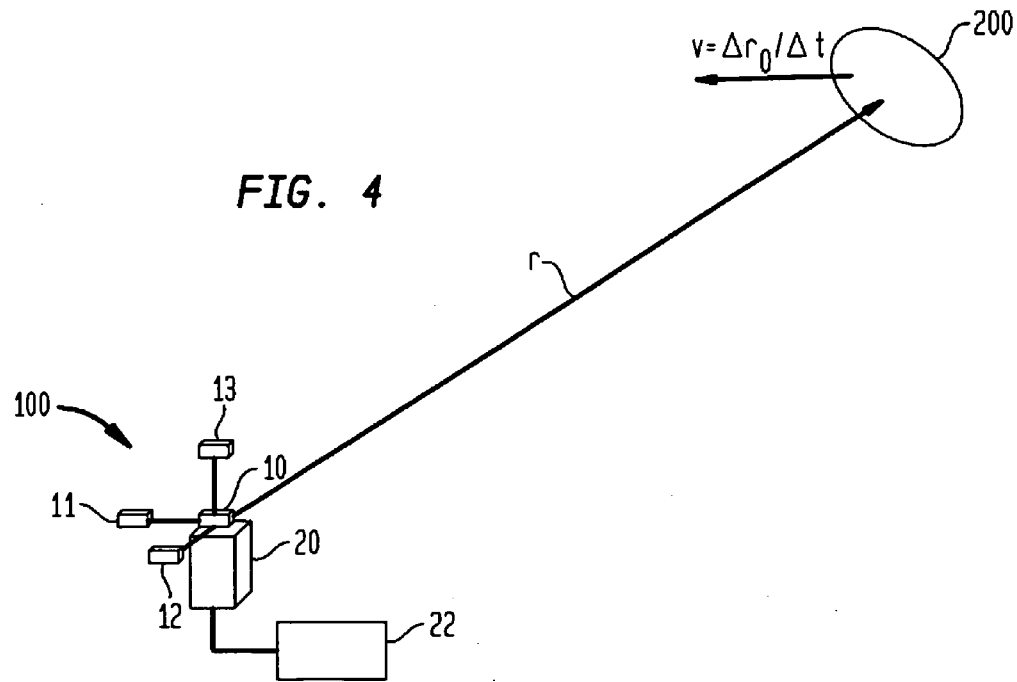
FIG. 4 is a schematic view of a system for tracking a moving magnetic target in accordance with the present invention.

Referring now to FIG. 4, a magnetic anomaly detection and ranging (MADAR) system 100 for tracking a moving magnetic target 200 in accordance with the present invention is shown. The term "target" as used herein refers to any object whose movement is of interest such that the tracking thereof is desirable. Magnetic target 200 is any natural or man-made object that moves on the ground, in the air, or in the water, with the object having an inherent magnetic signature owing to the ferrous material(s) that are included in the object's physical structure. Target 200 can be a self-propelled vehicle, a launched projectile without it's own propulsion, etc., that is moving along a path or trajectory at a constant or accelerating/decelerating velocity "v" thereby making the velocity (and magnetic signature) changeable in direction and magnitude.

Figure 5:
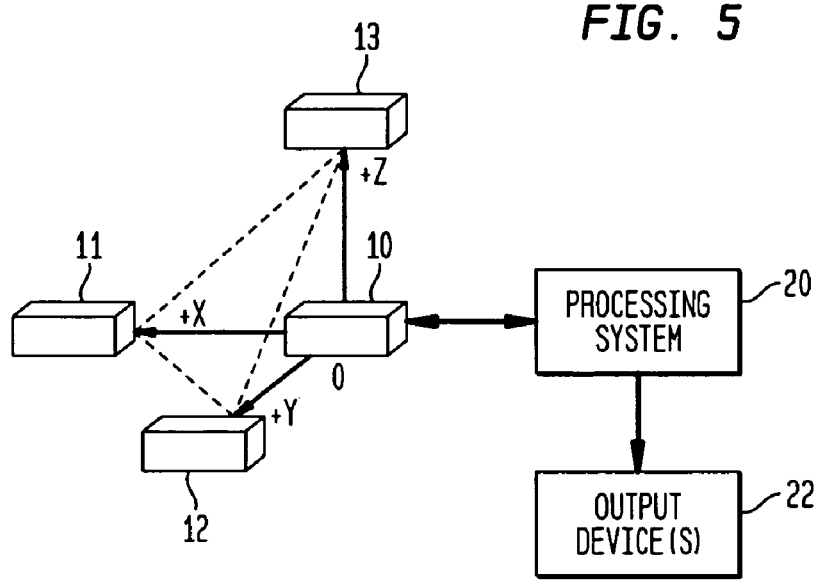
FIG. 5 is a four triaxial magnetometer (TM) sensor array that can be used in the present invention.

At the heart of tracking system 100 is a magnetic anomaly sensing system that uses a "magnetic sensor array" that can passively measure magnetic anomaly field components ($B_X$, $B_Y$, $B_Z$) associated with the target's magnetic dipole signature M, and then convert the data to magnetic anomaly field scalars (B) where $B=[(B_X)^2+(B_Y)^2+(B_Z)^2]^{0.5}$. FIG. 5 is a sketch of a tetrahedral sensor embodiment for the present invention where each of the sensors can be a triaxial magnetometer (TM) sensor. The TM sensors have essentially the same characteristics as those disclosed in detail in U.S. Pat. No. 6,841, 994. However, the present invention applies data processing methods that are significantly different than those of the '994 patent.

As is known in the art of STAR technology, the magnetic anomaly sensing system embodiments use pluralities of TM sensors with each of the TM sensors having X,Y,Z magnetic sensing axes. For each embodiment, the TM sensors are arranged in a three-dimensional array with respective ones of the X,Y,Z magnetic sensing axes being mutually parallel to one another in the three-dimensional array. The three-dimensional array defines a geometry that forms (i) a plurality of magnetometers (one at each point of the array), and (ii) single-axis gradiometers defined between pairs of points separated by distances defined along the XYZ coordinate axis directions of the array. A processing system coupled to the TM sensors generates magnetic anomaly field magnitudes, gradient tensor components, and corresponding complete gradient contraction(s), for each respective sensor array embodiment. In general, the processing system will include one or more digital processor(s) and one or more output device(s). For clarity of illustration, signal lines coupling the TM sensors to the processing system will not be shown.

The analog or digital outputs of the TM sensors are provided to the processing system which implements a novel magnetic anomaly field magnitude (B=|B|) based magnetic "scalar triangulation and ranging" (STAR) processing scheme as well as new processing methods that allow the present invention to perform longer-range tracking of moving magnetic targets while using fewer TM sensors than prior art technologies. The processing system includes signal processing hardware and software that can (i) use the TM sensors' data to simultaneously develop all B-field components, (ii) develop a 3-D array of scalar magnetic anomaly field parameters $B_I$ (i.e., a $B_I$-parameter for each I-th point of the array) and a gradient tensor G and, correspondingly, at least one gradient tensor magnitude or gradient contraction $C_T$, and (iii) use the $B_I$ parameters in the present invention's improved, longer-range STAR scheme for localization and classification/discrimination of magnetic objects. The ultimate result generated by the processing system is values indicative of a moving target's localization vector r and its magnetic signature vector M. These values are presented in human-discernable format(s) (e.g., audio and/or visual) and/ or computer-discernable format(s) by output device(s). It is to be understood that the particular processing schemes and output schemes provided by the processing system are within the skill in the art and are not limitations of the present invention.

The present invention's magnetic anomaly sensing system can utilize a variety of geometric arrangements of TM sensors without departing from the scope of the present invention. However, one of the great advantages of the present invention is that it does not need to use as many TM sensors as previous magnetic-anomaly STAR-technology-based systems. Accordingly, FIG. 5 illustrates one non-limiting example of a TM sensing system arrangement for use in the present invention. As will be explained below, this simple arrangement of four TM sensors can provide the input data needed to perform DLC and/or tracking of a magnetic target from relatively long range.

In FIG. 5, the geometric arrangement of TM sensors comprises an array of four TM sensors 10-13, with each sensor located at an I-th vertex of the array. Each TM sensor measures three orthogonal (XYZ) vector components of a total magnetic field $B_{TI}$ that is comprised by the vector sum of the Earth's field $B_{EI}$ and the magnetic anomaly field $B_I$ associated with magnetic target 200. The TM sensors' respective XYZ sensing elements will typically be parallel to one another. The origin (O) of the array's XYZ coordinates is located at the geometric center of the field-sensing elements of TM sensor 10.

Figure 6:
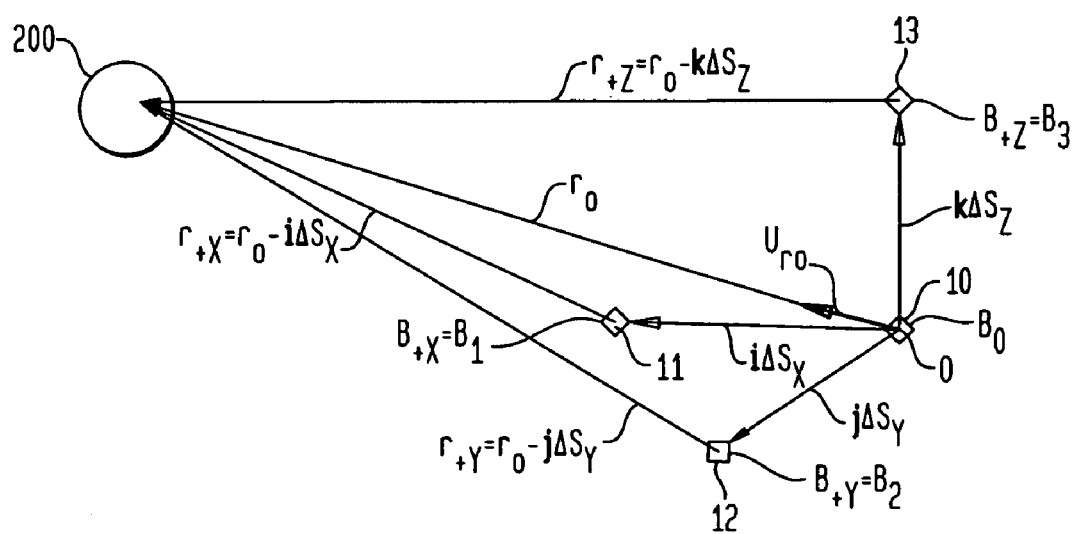
FIG. 6 is a graphic view of the magnetic anomaly magnitude ($B_I$)-parameters and triangulation baselines associated with the four TM sensor array embodiment of FIG. 5.

Referring additionally to the geometrical relationships illustrated in FIG. 6, the range $r_o$ to target 200 is referenced to the origin of XYZ coordinates for the TM sensor array that, in this embodiment, is the center of TM sensor 10. This simple tetrahedral array of four TM sensors 10-13 can provide the data used by the present invention's improved localization and discrimination methods. Each TM sensor measures the XYZ components of a total vector magnetic field ($B_T$) given by the vector sum of the Earth's field $B_E$ and any magnetic anomaly field B at its location. The TM sensors in each I-th vertex of the tetrahedron (where I=0,+X,+Y,+Z) constitute a vector total field magnetometer whose data are combined in a processing system 20 and used to calculate a $B_I$ parameter at the I-th vertex. The outputs of the processing system can be provided to one or more output devices 22 that can be incorporated with or separated from processing system 20 without departing from the scope of the present invention.

TM sensors 10-13 are arranged at the vertices of a right-angle tetrahedron that, for simplicity of calculations, is an "isosceles" tetrahedron, i.e., one with three equal sides. The right-angled corner of this arrangement is formed by the intersection of three orthogonal triangulation baselines. The right-angled vertex includes TM sensor 10, the origin (O), and +X,+Y,+Z coordinate axes of a Cartesian (XYZ) coordinate system.

The TM sensor at each vertex measures XYZ components of a total magnetic field $B_{T,I}$ comprised by the vector sum of the Earth's field ($B_E$) plus the magnetic anomaly field corresponding to point I, that is $B_I$. Processing system 20 subtracts previously stored calibration values of $B_{EIX}, B_{EIY}, B_{EIZ}$ from $B_{TIX}, B_{TIY}, B_{TIZ}$ to obtain anomaly field components $B_{IX}, B_{IY}, B_{IZ}$ corresponding to each I-th vertex. Next, processing system 20 uses the $B_{IX}, B_{IY}, B_{IZ}$ values to calculate a total magnetic field magnitude $B_I$ at each I-th point of the array. Since the X, Y and Z-axes associated with all of TM sensors 10-13 are typically parallel to one another, each pair of TM sensors comprised by one of TM sensor's 11, 12, 13 and TM sensor 10 forms a single-axis gradiometer aligned in each of the X, Y and Z directions. The data from the single-axis gradiometers are used to detect and compensate for temporal variations of the XYZ components of $B_E$, and calculate at least one gradient contraction magnitude that can be used in the determination of distance to target 200.

Processing system 20 develops combinations of magnetic anomaly field and gradient data, and computes a total magnetic anomaly field magnitude $B_I$ that corresponds to the position of each "I-th" TM sensor. Processing system 20 can also compute a total gradient contraction parameter $C_{TO}$ whose position approximately corresponds to the origin of coordinates O. Thus, each respective $B_I$-type parameter corresponds to (or "operates at") a particular point located on a coordinate axis of the array at a distance from the origin of O for $B_1$, and, respectively, $+\Delta S_X, +\Delta S_Y, +\Delta S_Z$ for $B_1, B_2, B_3$. The operating points of the $B_I$-parameters constitute the endpoints of an orthogonal array of triangulation baselines. As illustrated in FIG. 6, the baselines are aligned along the XYZ directions and one endpoint of each baseline is located at origin O. The $B_I$-parameters and triangulation baselines constitute the primary target-ranging and target-classification parameters of the present invention.

The geometrical configuration of parameters from the above-described symmetrical, three-dimensional STAR sensor array is capable of being used to generate at least four $B_I$ parameters (where I=O, +X, +Y, +Z) and three triangulation baselines $\Delta S_X, \Delta S_Y, \Delta S_Z$. The $B_I$ measurement points and $\Delta S_i$ baselines are disposed on the axes of an XYZ coordinate system whose origin (O) is located at the right-angled vertex of the tetrahedral array. Specific coordinates of the $B_I$-parameter measurement points are:

$B_1 = B_{+X} = (\Delta S_X, 0, 0);$ $B_2 = B_{+Y} = (0, \Delta S_Y, 0);$ $B_3 = B_{+Z} = (0, 0, \Delta S_Z);$ and $B_O = (0, 0, 0).$ In order to detect, discriminate and compensate for the temporal variations of the XYZ components of Earth's field $B_E$, the present invention also develops nine gradient tensor components along with the triangulation baselines: $\Delta B_X/\Delta S_X$, $\Delta B_Y/\Delta S_X$, $\Delta B_Z/\Delta S_X$, $\Delta B_X/\Delta S_Y$, $\Delta B_Y/\Delta S_Y$, $\Delta B_Z/\Delta S_Y$, $\Delta B_X/\Delta S_Z$, $\Delta B_Y/\Delta S_Z$, $\Delta B_Z/\Delta S_Z$.

Referring again to FIG. 6, geometrical relationships are illustrated between magnetic target 200 and the quantities $B_I$, $\Delta S_i, r_I, r_o$, and a unit vector ($U_{ro}$) in the direction of the target that the present invention's methods use for tracking moving targets. In the present invention's innovative application of the central potential type function $B_I = (\mu/4\pi)k_B M r_I^{-3}$, the $r_I$ term corresponds to the magnitude of the position vector of target 200 with respect to each $B_I$ measurement point (I) where I=0, 1, 2, 3 or, equivalently, I=0, +X, +Y, +Z. Thus, for example, $B_{+Z} = (\mu/4\pi)k_B M(r_{+Z})^{-3}$. The central $r_o$ vector is the target position vector measured with respect to the point O of the STAR sensor array that is also the origin of the XYZ/i,j,k coordinate system. The geometry of the invention's sensor array facilitates transformation between the $r_o$ vector and the $r_I$ vectors and, thereby, facilitates the invention's improved DLC methods.

Figure 7:
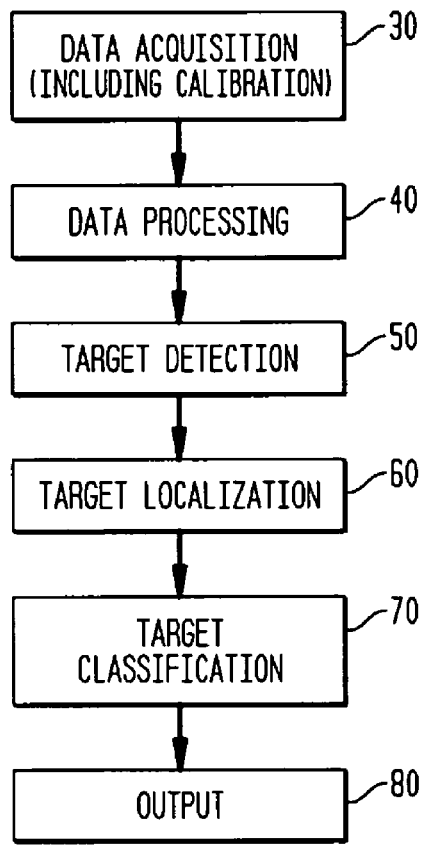
FIG. 7 is a simplified flowchart of the general process steps of the present invention.

Referring additionally now to the flowchart presented in FIG. 7, the general operation of the invention for tracking magnetic objects will be described. Note that specific details, e.g., number and spacing of $B_I$ parameters, development and use of gradients, etc., will depend on the specific sensor system embodiment and its application. The simplified flowchart illustrated in FIG. 7 presents six basic steps in the present invention. Data acquisition step 30 has been previously disclosed in one or more of the above-noted patents. Briefly, processing system 20 reads and stores vector components of total $B_{T,I}$-field data from each I-th TM sensor of the sensor array. The $B_{T,I}$-field data are processed to discriminate XYZ components of magnetic anomaly $B_I$-field data as described below.

Figure 8:
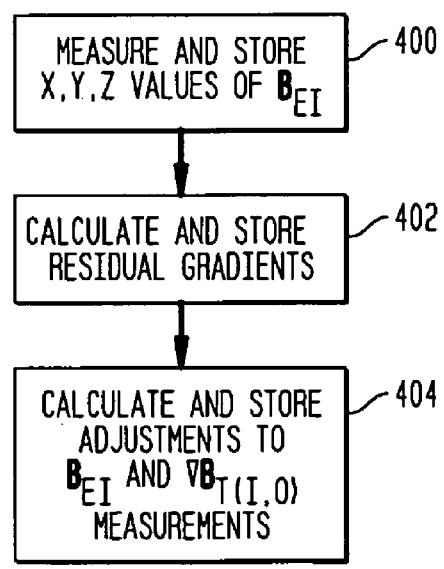
FIG. 8 is a flowchart of the calibration process used in the present invention.

Steps 40 through 70 apply the present invention's novel magnetic anomaly magnitude-based approaches for improved detection, localization and classification (DLC) and tracking of a moving magnetic target. Data processing step 40 includes: (i) Calibration to determine correction factors for compensation of differences between the responses of TM field-sensing elements. (The development of the calibration factors is described in more detail in the flowchart of FIG. 8.) (ii) Application of calibration factors to the raw $B_T$-field data to compensate for variances between sensor system measurement channels. (iii) Magnetic anomaly field components are calculated by subtracting pre-calibrated values of Earth's field $B_E$ from the compensated $B_T$ data. (iv) Magnetic gradients are calculated in the XYZ directions between TM sensors. (As is known in the art of magnetic gradient processing, imbalance compensation can be applied to the tensor components to improve accuracy of the gradient measurement process.) (v) The total, three-component magnetic anomaly field magnitudes $B_I$ are calculated for each respective TM sensor of the STAR sensor array. (vi) A gradient contraction $C_T$ parameter (or parameters depending on the sensor embodiment) is calculated.

Target detection step 50 includes the following processes: (i) The $B_I$ parameters are compared to their detection threshold values. (If the threshold(s) is (are) not exceeded, no target has been detected and the process returns to step 30. If the thresholds are exceeded the target detection process continues.) (ii) The $C_T$ parameter(s) is (are) compared with a gradient threshold value. (Typically, in order to avoid false indications of target detection, the threshold value is selected to be well above, i.e., approximately greater than 3 dB, the sensor's electronic noise level. If the selected gradient threshold is not exceeded, it is assumed there is no target and that the detected changes in $B_I$ are due to temporal changes in the Earth's background field $B_E$. Then the processor stores the new $B_E$ values and steps 30 and 40 are repeated. If the gradient-related threshold is exceeded, a target-of-interest is assumed to have been detected and the $B_I$ parameters are passed to step 60 for processing in accordance with the methods of the present invention.)

Target localization step 60 involves the application of one or both of two magnetic anomaly magnitude-based schemes for determining the target position vector $r_o$ from the target to the origin of coordinates of the TM sensor array. The first of these schemes, referred to herein as the "directional derivative" (DD) method, is particularly useful when more than one magnetic target may be passing through the detection range (or field-of-view) of the sensor system. The second of these schemes, referred to herein as the "least squares fit" (LSF) method, is useful when the moving magnetic target is isolated in a fairly constant background field such as the Earth's magnetic field. The two methods can be performed in parallel (e.g., simultaneously if the processor is a parallel processor) with the results of the two approaches then being correlated to provide a robust target-tracking methodology. Both the DD method and the LSF method have the advantage that they do not require a particular axis of a sensor array to be pointed toward the target. Thus, both of these methods obviate the need for a mechanical positioner. Details of these methods for use with the contraction parameter $C_T$ are disclosed in U.S. patent application Ser. No. 12/214,803, filed Jun. 23, 2008.

Target classification step 70 uses the vector components of $r_o$ (that were determined in classification step 60) in the magnetic dipole equation and the magnetic gradient equations to determine the components of magnetic signature M. The invention's B-STAR-derived values of $r_o$ and M can also be used in a least-squares-fit type asphericity compensation scheme that removes measurement errors (i.e., the aforementioned "asphericity errors") that can be caused by the B-potential field's departure from perfect spherical symmetry.

Output step 80 outputs the magnetic target's position vector and magnetic moment vector to one or more output devices (e.g., a visual display, an audio output, etc.) and/or another application (e.g., a remote targeting unit) for further processing in which case the DLC-related data can be in a processing or computer-discernable format.

In order to perform accurate DLC of a moving magnetic object, the present invention's processing system 20 must be properly calibrated with no target present and the sensor system fixed in position. Accordingly, as mentioned above, data processing step 40 includes the following calibration process. With no target present, the following are true: (i) B=0, (ii) $B_T=B_E$; and (iii) $\nabla B_T=\nabla B_E$ or approximately 0. The flowchart in FIG. 8 describes the three basic steps of the calibration process. With reference also to the simple tetrahedral embodiment of FIG. 5, the present invention's calibration method comprises the following steps:

1. Step 400 measures and stores the vector total field values $B_{TI}=B_{EI}+B_I=(B_{EI\ X}+B_{I\ X})i+(B_{EI\ Y}+B_{I\ Y})j+(B_{EI\ Z}+B_{I\ Z})k$ measured by each I-th TM sensor. With no target present, $B_{I\ X}=B_{I\ Y}=B_{I\ Z}=0$ and so the only field that is present to be measured/calibrated is $B_{EI}$. In particular, this step of calibration determines the values of XYZ components of Earth's field $B_{EI\ X}, B_{EI\ Y}, B_{EI\ Z}$ that are measured by each I-th TM in the array.

2. Step 402 determines residual gradient imbalance errors where $\nabla B_{TI\ (XYZ)}$ is approximately $\Delta B_{TI\ (XYZ)}/\Delta S_{(X,Y,Z)}$ in the XYZ directions between each of TM sensors 11-13 located at $+\Delta S_X, +\Delta S_Y, +\Delta S_Z$ and TM sensor 10 located at origin O. For example, the gradients in the $\Delta S_X$ direction are: $(B_{T1\ X}-B_{T0\ X})/\Delta S_X$, $(B_{T1\ Y}-B_{T0\ Y})/\Delta S_X$, $(B_{T1\ Z}-B_{T0\ Z})/\Delta S_X)=(B_{E1\ X}-B_{E0\ X})/\Delta S_X$, $(B_{E1\ Y}-B_{E0\ Y})/\Delta S_X$, $(B_{E1\ Z}-B_{E0\ Z})/\Delta S_X)$. Similar gradients are obtained in the $\Delta S_Y$ and $\Delta S_Z$ directions. Again, with no target present, non-zero values of the gradients indicate sensor channel imbalances that must be "calibrated out."

3. Step 404 calculates and stores all respective calibration adjustments for the above-determined $B_{EI\ (XYZ)}$ and $\nabla B_{EI\ (XYZ)}/\Delta S_{(X,Y,Z)}$ values. The invention's calibration adjustments are used during operation of the invention to compensate the sensor for differences between "measurement channels," and discriminate between XYZ components of Earth's field $B_E$ and the XYZ components of magnetic anomaly field B.

As used herein, a "measurement channel" is defined to include the following: (i) A particular analog field-sensing element and the associated electronic circuitry of a particular TM sensor. (ii) The corresponding analog-to-digital converter (ADC) circuitry (also commonly referred to as the ADC's channel) that converts (or, digitizes) the TM sensors' analog data to digital format. For example, the X-axis field-sensing circuitry of TM sensor 11 and the corresponding ADC circuitry that digitizes the analog data from the X-axis field-sensing element of TM sensor 11 comprise one channel of the sensor system. As is known in the art of magnetic sensing, due to typical variations in the response of electronics circuitries, prior to completion of the digitization process, different measurement channels may produce different measurements for the same value of applied B-field. The calibration step basically measures and records the responses of all sensor channels to the same $B_E$ field. The calibration data can then be used by the system's processor (during sensor system operation) to enhance the accuracy of target-tracking measurements by compensating or equalizing the B-field responses of all sensor system channels. Since the channels' responses can change over time the calibration process is typically repeated periodically.

Figure 9:
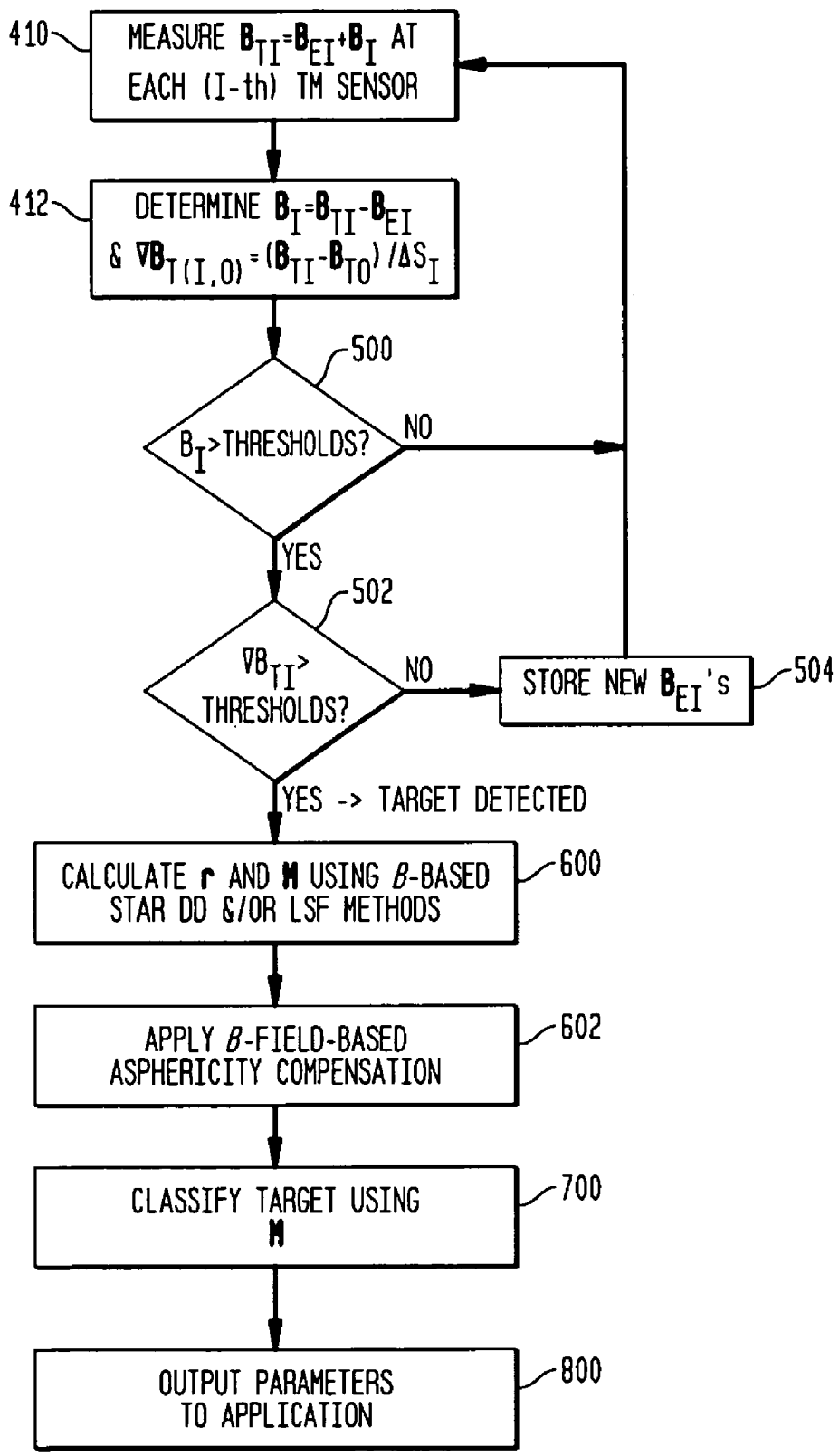
FIG. 9 is a flowchart with details of the process steps of the present invention.

FIG. 9 is a flowchart of operation of the invention after it has been calibrated in accordance with the above-mentioned calibration steps. That is, FIG. 9 presents the remainder of data processing step 40 as well as steps 50-80 where the first or "hundreds" place in a reference numeral refers to the general step discussed above (e.g., the "4" in step 410 indicates that this is part of data processing step 40).

With continuing reference to the sensor embodiment depicted in FIG. 5, sensor system operation consists of the following specific steps:

1. Step 410: Measurement and storage of channel-compensated vector components of total field $(B_{TI}=B_{EI}+B_I=(B_{EI\ X}+B_{I\ X})i+(B_{EI\ Y}+B_{I\ Y})j+(B_{EI\ Z}+B_{I\ Z})k)$ that are measured by each TM sensor.

2. Step 412: (a) Calculation of magnetic anomaly field components $B_I=B_{TI}-B_{EI}$ (using previously determined (calibrated) values of $B_{EI}$. (b) Calculation of gradients $\Delta B_{TI\ (XYZ)}/\Delta S_{(X,Y,Z)}$ in the XYZ directions between TM sensors 11-13 located at $+\Delta S_X, +\Delta S_Y, +\Delta S_Z$ and TM sensor 10 located at origin O.

3. Step 500: Comparison of data from part "(a)" in step 412 with threshold values for detection of changes in $B_I$ to determine if a target is present. (Alternately, this step could compare the most recently measured values of $B_T$ with previously measured and stored values of $B_T$). If there has been no threshold-exceeding change in $B_I$ and/or $B_T$, no target has been detected and steps 410 and 412 are repeated. If the threshold(s) has been exceeded, the process goes to step 502.

4. Step 502: Comparison of data from part "(b)" in step 412 with respective gradient threshold values to determine if the changes in $B_T$ are due to time-dependent changes in $B_E$ or if the changes in $B_T$ are due to the presence of a detected target. If the gradient threshold values are not exceeded, then the measured changes in $B_T$ are due to time-dependent variations in $B_E$ and the program goes to step 504. If the gradient threshold values are exceeded, a target has been detected and the process goes to step 600.

5. Step 504: The new values of $B_E$ are stored and the process returns to step 410.

Figure 10:
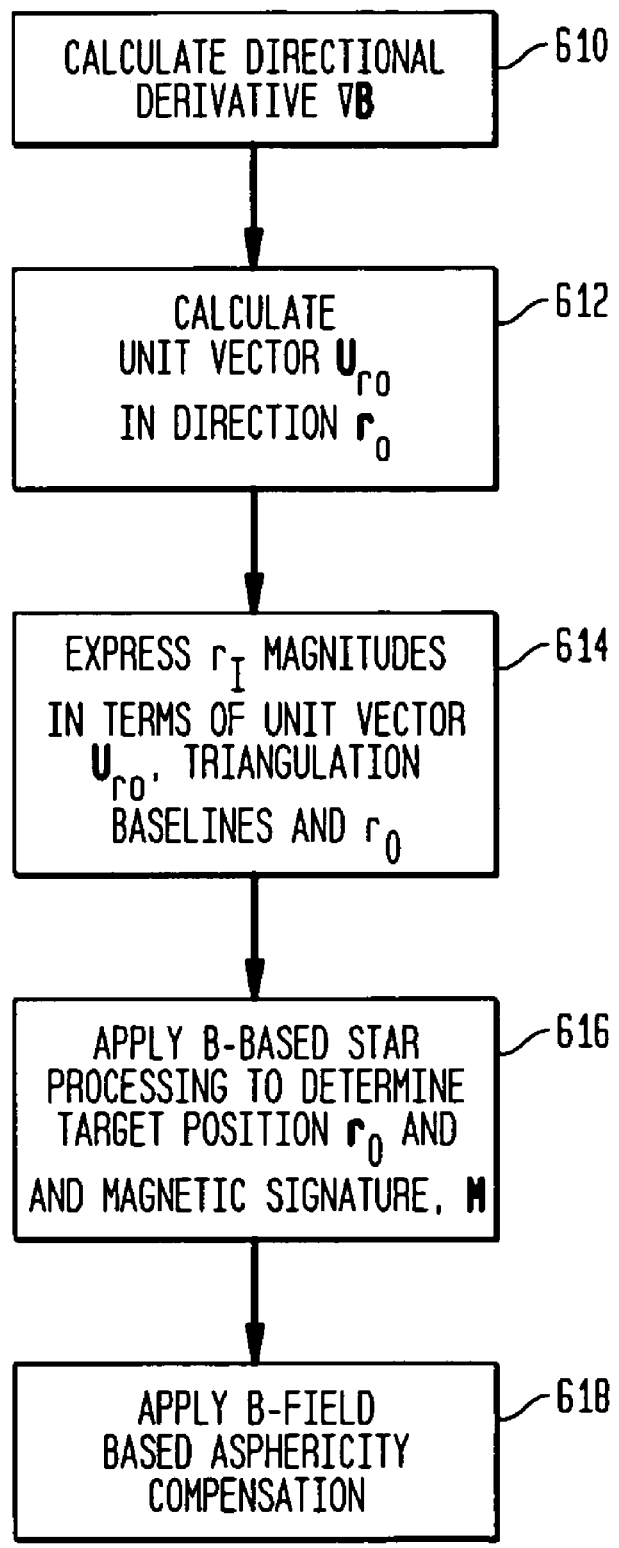
FIG. 10 is a flow chart of the directional derivative (DD) STAR method that can be employed by a tracking system in accordance with the present invention.
Figure 11:
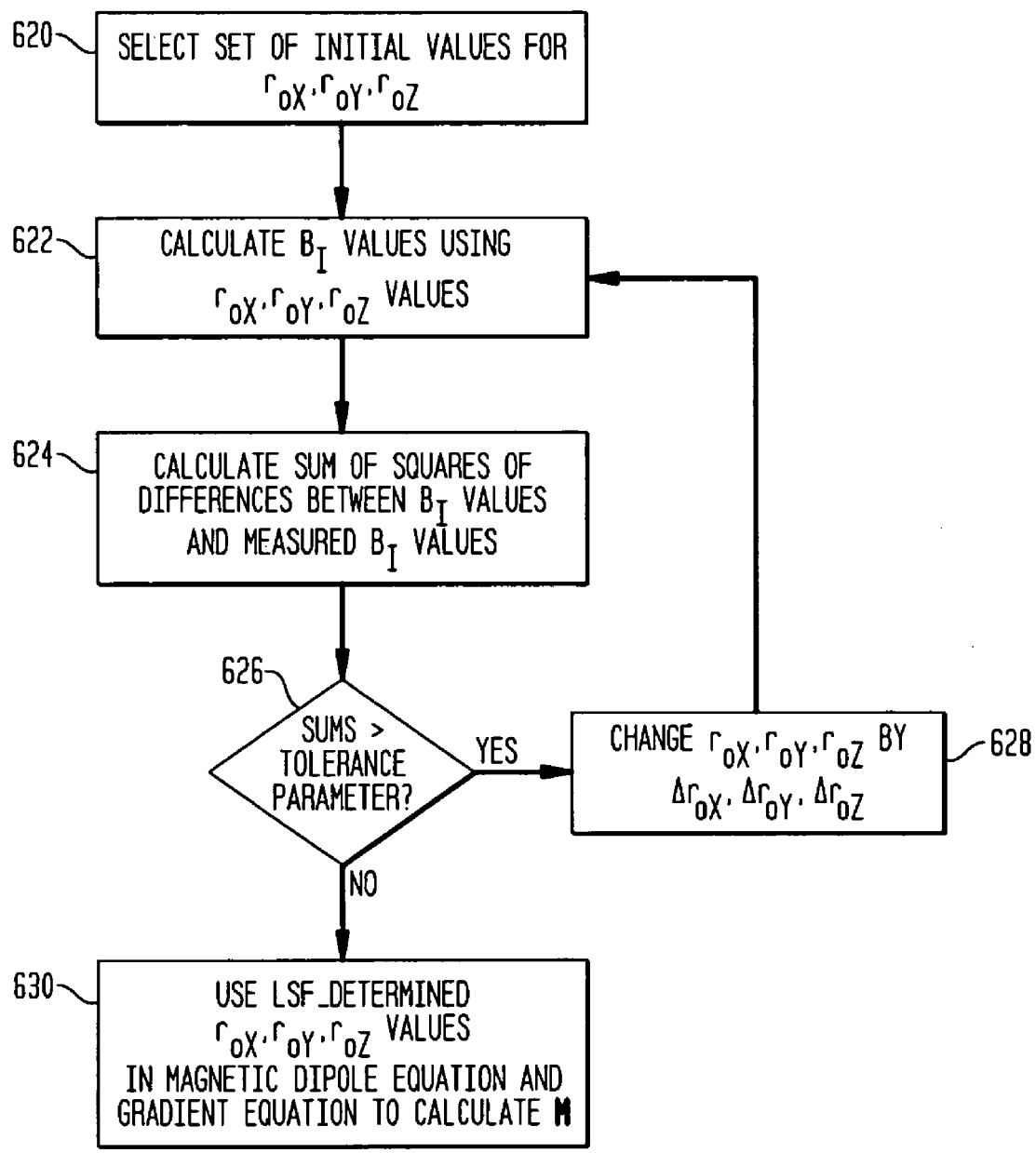
FIG. 11 is a flow chart of the least squares fit (LSF) STAR method that can be employed by a tracking system in accordance with the present invention.

6. Step 600: Calculation of XYZ components of target position $r_o$ and magnetic signature M using one or both of the invention's new magnetic anomaly magnitude-based STAR schemes; namely, a directional derivative (DD) method (FIG. 10) or a least-squares-fit (LSF) method (FIG. 11).

Figure 12:
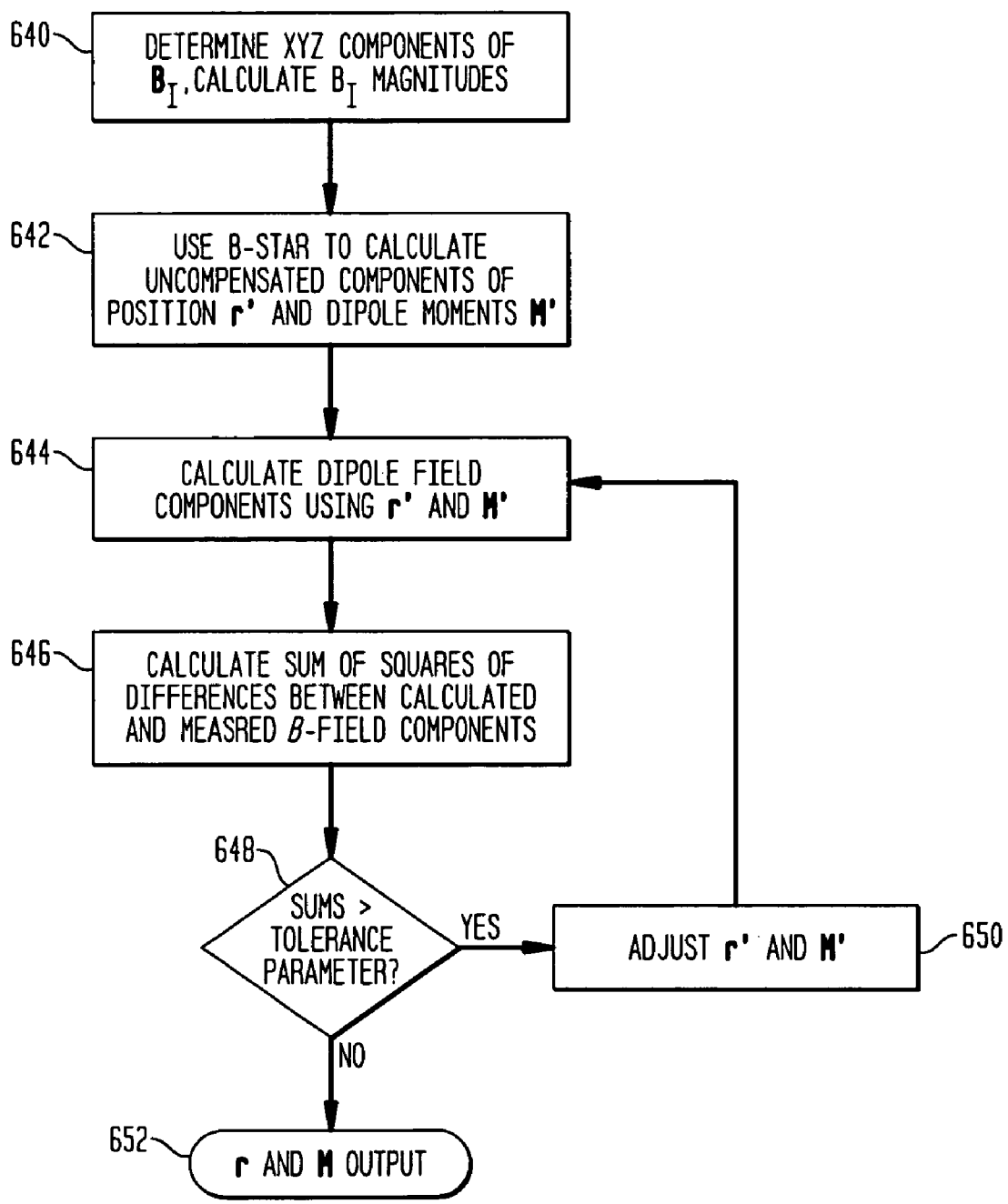
FIG. 12 is a flow chart of the asphericity error compensation that can be employed by the present invention.

7. Step 602: Application of an asphericity compensation process (FIG. 12) to adjust the r and M values that were determined in step 600 for errors due to the aspherical nature of the magnetic anomaly magnitude field.

8. Step 700: The asphericity-compensated values of M are used to magnetically classify target 200 by comparing the M values that are determined by the invention with a previously determined database (e.g., stored in the invention's processor) relating M-values to specific targets. The development of the database of target M-values is straightforward as would be understood by one of ordinary skill in the art.

9. Step 800: Provision of human-discernable and/or computer-discernable information regarding target position, magnetic signature, and changes in these parameters to the desired application. For example an application could involve intelligence gathering and/or remotely pointing a device such as a camera or weapon at the moving object.

The DD method will be explained with the aid of the flowchart illustrated in FIG. 10 that outlines the basic steps of this novel process for using magnetic anomaly field magnitudes for target localization and classification. The DD method applies the principles disclosed in the afore-cited U.S. patent application Ser. No. 12/214,803, but replaces the contraction parameters with the B-STAR developed magnetic anomaly magnitudes or B-parameters. That is, in the present invention, the DD method uses the magnetic anomaly magnitude $B_T$-parameters developed in step 412 of FIG. 9. Note that for a dipole field, $B_I = (\mu/4\pi)k_B M r_I^{-3}$, $r_I$ is the vector from the $B_I$ measurement point to the target. Thus, $B_I$ has the form of a central potential type field and the gradient thereof is a vector that points toward the source of the potential field; namely, the magnetic object or target.

The first step 610 of the DD method involves calculation of the spatial gradient of B (i.e., $\nabla B$). The magnitude of $\nabla B$ (i.e., $|\nabla B|$) is the value of the directional derivative of the function $B = (\mu/4\pi)k_B M r^{-3}$ in the direction of the greatest rate of change of B; that is, in the direction $r_o$ toward the target. Thus, step 610 calculates $\nabla B$ which is approximately $i(\Delta B_X/\Delta S_X) + j(\Delta B_Y/\Delta S_Y) + k(\Delta B_Z/\Delta S_Z)$ where i,j,k are unit vectors along the sensor's XYZ axes and $\Delta B_X = (B_{+X,X} - B_{0,X})$, etc. Note that the gradient $\nabla B$ of the scalar quantity B is a vector (not a tensor) in the direction of the $r_o$ vector and is measured with respect to the center of coordinates O of the TM sensor array. Also, note that $\nabla B \propto r^{-4}$ whereas $B \propto r^{-3}$. Therefore, $\nabla B$ decreases more rapidly with sensor-target distance r than B does. However, as discussed below, the $\nabla B$ quantities are primarily used to define a direction toward the target while the DD-STAR's target-detection and target-ranging processes primarily use parameters $B_I \propto r_I^{-3}$. Furthermore, the combined use of B-scalars, $\nabla B$-vectors, and $\nabla B$-tensor derived quantities, provides the invention with unique and valuable capabilities for discrimination of multiple magnetic targets.

Next, at step 612, the unit vector ($U_{ro}$) along the $r_o$ vector to the target is calculated. That is, step 612 calculates $U_{ro} = \nabla B / |\nabla B|$. Thus, the terms of $U_{ro}$, $r_o = r_o U_{ro}$ and the XYZ components of $r_o$ are $r_{oX} = r_o U_{ro} \cdot i$, $r_{oY} = r_o U_{ro} \cdot j$, $r_{oZ} = r_o U_{ro} \cdot k$ where the "bold dot" represents a scalar multiplication operation between two vectors. Step 614 expresses magnitudes of $r_I$ vectors in terms of their respective triangulation baselines $\Delta S_i$, $r_o$, unit vector $U_{ro}$, and XYZ unit vector (i.e., i,j,k). More specifically, this step involves calculations of scalar projections (i.e., distances) of triangulation baselines in the direction of the $r_o$ vector to the target. Mathematically, step 614 calculates $U_{ro} \cdot i \Delta S_X$, $U_{ro} \cdot j \Delta S_Y$, and $U_{ro} \cdot k \Delta S_Z$. For example, with reference to FIG. 6, $|r_{+X}| = |r_o - i \Delta S_X|$, etc. That is, for the scalar projection distance $r_{+X}$, a) $r_{+X} = [(r_o - i\Delta S_X) \cdot (r_o - i\Delta S_X)]^{0.5}$ b) $= [r_o^2 - 2r_o \cdot i\Delta S_X + (\Delta S_X)^2]^{0.5}$ c) $= r_o[1 - 2U_{ro} \cdot i\Delta S_X/r_o + (\Delta S_X/r_o)^2]^{0.5}$ Note that c) can be solved directly for $r_o$; however, it is useful to apply the following approximately to linearize/simplify the equation. Neglecting very small terms such as $(\Delta S_X/r_o)^2$, the approximation for $r_{+X}$ is $(r_o - U_{ro} \cdot i\Delta S_X)$ for $r_o$ greater than $3\Delta S_X$. Similar relations in terms of $r_o$, $U_{ro}$, and the respective baselines $\Delta S_i$ can be obtained for the magnitudes of the remaining projection distances $r_{+Y}$ and $r_{+Z}$.

Next, at step 616, the present invention's magnetic anomaly magnitude based STAR process is applied using the magnetic anomaly magnitude $B_I$ parameters and the relations between $r_I$ (and/or $r_o$) magnitudes and the respective scalar projections determined in step 614. For example, $B_{+X} = (\mu/4\pi)k_B M(r_{+X})^{-3}$ and $B_0 = (\mu/4\pi)k_B M(r_o)^{-3}$ $B_0/B_{+X} = (r_{+X}/r_o)^3 \rightarrow r_{+X}/r_o = (B_0/B_{+X})^{0.333}$ $r_{+X}/r_o = (r_o - U_{ro} \cdot i\Delta S_X)/r_o = (B_0/B_{+X})^{0.33}$ $r_o = (U_{ro} \cdot i\Delta S_X)[1 - (B_0/B_{+X})^{0.33}]^{-1}$ Thus, $r_o = r_o U_{ro} = \{U_{ro} \cdot i\Delta S_X[1 - (B_0/B_{+X})^{0.33}]^{-1}\}U_{ro}$.

As indicated above, step 616 could use any two of the corresponding pairs of $B_I$-parameters (i.e., either $(B_{+X}, B_0)$ or $(B_{+Y}, B_0)$ or $(B_{+Z}, B_0)$) to determine $r_o$. However, for best accuracy, this step preferably uses the relations between $U_{ro}$ and all of the $B_I$, $r_I$, and $\Delta S_i$ to determine the best average value for the XYZ components of target position vector $r_o$. Specifically, the XYZ components of $r_o$ are calculated where $r_{oX} = i \cdot r_o U_{ro}$, $r_{oY} = j \cdot r_o U_{ro}$, and $r_{oZ} = k \cdot r_o U_{ro}$. Upon determination of $r_o$ and/or an $r_I$ value, a value for $M' = (\mu/4\pi)k_B M = B_I r_I^3$ can also be obtained in this step. Since the value of $k_B$ is between 1 and 2, M' determines the range of self-consistently acceptable values for magnitude of the magnetic signature M, i.e., $(4\pi/2\mu)B_I r_I^3 \leq M \leq (4\pi/\mu)B_I r_I^3$. For the present invention, the XYZ components of M can be calculated in this step by using the $r_{oX}$, $r_{oY}$, $r_{oZ}$ in the above-mentioned magnetic dipole equation. Specifically, by substitution of $r_{oX}$, $r_{oY}$, $r_{oZ}$ in the following set of three equations, the unknown quantities $M_X$, $M_Y$ and $M_Z$ are readily determined.

$B_X = (\mu/4\pi)[(3r_{oX}^2 - r_o^2)M_X + 3r_{oX}r_{oY}M_Y + 3r_{oX}r_{oZ}M_Z]r_o^{-5}$ $$B_Y=(\mu/4\pi)[3r_{oX}r_{oY}M_X+(3r_{oY}^2-r_o^2)M_Y+3r_{oY}r_{oZ}M_Z]/r_o^{-5}$$

$$B_Z=(\mu/4\pi)[3r_{oX}r_{oZ}M_X+3r_{oY}r_{oZ}M_Y+(3r_{oZ}^2-r_o^2)M_Z]/r_o^{-5}$$

Also, as described in the '994 patent, by using the $r_o$ components in the gradient tensor equations, the XYZ components of the target signature vector M can be calculated in target classification step 70 (FIG. 7) and compared with the values obtained using the present invention's magnetic dipole equation determined values. For target classification, the value obtained for $|M|=[(M_X)^2+(M_Y)^2+(M_Z)^2]^{0.5}$ should be consistent with the range of M-values that was determined in step 616.

If desired, an asphericity compensation scheme analogous to that disclosed in the '399 patent can be applied in step 618 to enhance DLC accuracy by removing errors in $r_o$ and M values due to the asphericity of the $B_I$ potential field. The resulting target parameters (e.g., $r_o$ and M values) subsequently can be output to (i) a user display and/or audio device, and/or (ii) another application. Note that for some applications the $r_o$ values could also be conveniently expressed in spherical coordinates (e.g., in rθφ coordinates located at the origin of coordinates O) in terms of the target's scalar range $r_o$, its elevation angle θ, and its bearing angle φ, relative to the sensor system.

When there is only a single, magnetic dipole type target in the TM sensor array's field-of-view, the present invention's LSF method may provide target localization results that are less susceptible to sensor system noise. The LSF method applies the principles disclosed in the afore-cited U.S. patent application Ser. No. 12/214,803, filed Jun. 23, 2008, but replaces the contraction parameters with the B-STAR developed magnetic anomaly magnitudes or B-parameters. The LSF method for the present invention will now be explained with the aid of the flowchart illustrated in FIG. 11. The LSF method also uses the magnetic anomaly magnitude $B_I$ parameters developed in step 412 (FIG. 9) to self-consistently determine the set of XYZ components of $r_o$ (i.e., $r_{oX}, r_{oY}, r_{oZ}$) that provide the best fit (in a least-squares sense) to the set of four equations defined by $B_I=(\mu/4\pi)k_BMr_I^{-3}$, i.e., the four equations for the parameters $B_0, B_1, B_2, B_3$ or, equivalently, $B_O, B_{+X}, B_{+Y}, B_{+Z}$. For example, with reference to FIG. 6, in terms of $r_o$ (e.g., the vector from the origin of coordinates of array to target), unit vector i, and triangulation baseline $\Delta S_X$, the equation for $B_{+X}$ can be expressed as follows:

$$B_{+X}=(\mu/4\pi)k_BM[|(r_o-i\Delta S_X)|]^{-3}$$

$$=M'[r_o^2-2r_o\cdot i\Delta S_X+(\Delta S_X)^2]^{-1.5}$$

$$=M'[r_o^2-2r_{oX}\Delta S_X+(\Delta S_X)^2]^{-1.5}$$

where $r_o=[(r_{oX})^2+(r_{oY})^2+(r_{oZ})^2]^{0.5}$ and $M'=(\mu/4\pi)kM$.

Specifically, as indicated in the flowchart of FIG. 11, the LSF method comprises the following steps:

1. Step 620 selects a set of initial values for $r_{oX}, r_{oY}, r_{oZ}$ in accordance with the magnetic anomaly magnitude based "or B-STAR constraint" discussed below.
2. Step 622 uses the $r_{oX}, r_{oY}, r_{oZ}$ values in the $B_I$ equations to calculate a set of $B_I$ parameters and their ratios.
3. Step 624 calculates the sum of squares of the differences between the calculated $B_I$ values and the $B_I$ values that were measured by the sensor array.
4. Step 626 determines if the sum of squares is greater than a predetermined "tolerance parameter". If the sum of the squares is greater, the process goes to step 628 described below. If the sum of the squares is less than or equal to the tolerance parameter, the process goes to step 630 described below.
5. Step 628 applies a set of differential "adjustments" ($\Delta r_{oX}, \Delta r_{oY}, \Delta r_{oZ}$) to the $r_{oX}, r_{oY}, r_{oZ}$ values and returns to step 622. The differential "adjustments" $\Delta r_{oX}, \Delta r_{oY}, \Delta r_{oZ}$ can be determined by using a procedure such as Newton's root-finding method (or equivalent) in combination with the "STAR constraint" described below.
6. Similar to step 616 of the DD method, step 630 of the LSF method calculates the XYZ components of target signature vector M using the $r_o$ components (developed in steps 622-628) in (i) the magnetic dipole equation; and (ii) the gradient tensor equations. Part (ii) should yield results consistent with the results from (i). Note that upon determination of $r_o$ and/or an $r_I$ value, a value for $M'=(\mu/4\pi)k_BM=B_Ir_I^3$ can also be obtained in this step. Since the value of $k_B$ is between 1 and 2, M' determines the range of self-consistently acceptable values for M, i.e., $(4\pi/2\mu)B_Ir_I^3 \leq M \leq (4\pi/\mu)B_Ir_I^3$. In step 630, the value obtained for $|M|$ should be consistent with the acceptable range of M-values. If desired, asphericity compensation can be applied at step 630 to the $r_o$ and M values to enhance their accuracy. The resulting target parameters (e.g., asphericity-compensated $r_o$ and M values) can be output to one or more of a display device, an audio device, and another application such as a remote targeting device. Again, note that for some applications, the $r_o$ values could also be conveniently expressed in spherical coordinates (e.g., in rθφ coordinates located at origin of coordinates O) in terms of the target's scalar range $r_o$, its elevation angle θ, and its bearing angle φ, relative to the sensor system.

With regard to the "B-STAR constraint" mentioned in steps 620 and 628 above, note that the $B_I$ equations referred to in step 622 are polynomial equations of the third degree in the unknown quantity $r_o$ and its components (i$r_{oX}$, j$r_{oY}$, k$r_{oZ}$). The existence of multiple roots for such an equation can lead to problems of "uniqueness" wherein multiple LSF-derived solutions may exist for a given set of $B_I$ parameters. In order to ensure rapid convergence of the LSF process toward the one true position of the target, the following approach is used. For each set of $B_I$ parameters, the processes of first selecting and then iteratively adjusting $r_{oX}, r_{oY}, r_{oZ}$ preferably should be performed subject to a unique magnetic anomaly magnitude based "B-STAR constraint." The B-STAR constraint requires the components i$r_{oX}$, j$r_{oY}$, k$r_{oZ}$, respectively, to be numerically proportional to, and have the same sign as, the components of ∇B that are approximately i($\Delta B_X/\Delta S_X$)+j($\Delta B_Y/\Delta S_Y$)+k($\Delta B_Z/\Delta S_Z$). Then, the resultant LSF solution for $r_o$ will be forced to be parallel to, and have the same sense as ∇B, and thereby uniquely correspond to the most accurate (i.e., within the limits of "asphericity errors") true position of the magnetic target.

The $r_o$ and M values independently determined by the DD and LSF methods can also be correlated to one another as part of target localization step 60 and target classification step 70 (FIG. 7). Since it will generally not be known if a moving target is isolated or accompanied by one or more other targets, it may be preferred to correlate the results from the LSF and DD methods with each other and with the measurements of individual tensor components of the gradient tensor G to provide more accurate real-time DLC and a modality for improved characterization of the target-related magnetic anomaly field. Note that these correlations would be more effective for discerning multiple targets if more complex sensor array embodiments are used instead of the simple tetrahedral array embodiment of FIG. 5. That is, the present invention is not limited to the simple tetrahedral array of TM sensors illustrated in FIG. 5. Thus, it is to be understood that the present invention can utilize TM sensor arrays that add TM sensors to the above-described simple tetrahedral array to provide improved discrimination of multiple magnetic objects. For example, an octahedral array of six TM sensors where each TM sensor is positioned at a vertex of an octahedron or a cubic array of eight TM sensors where each TM sensor is positioned at a vertex of a cube would provide more effective capabilities for discrimination and tracking of multiple targets.

Asphericity compensation for the $C_T$-based STAR technology has been disclosed in the above-cited '399 patent. The application of such compensation in the present invention's B-STAR technology will now be described with the aid of the flow chart illustrated in FIG. 12. Briefly, the error compensation employs a combination of a non linear least-squares fit scheme to solve for r and a linear least-squares-fit-type approach to solve for M. The asphericity compensation process iteratively adjusts the solutions for target position (r) and magnetic moment (M) to provide a best fit to the magnetic dipole equation.

More specifically, at step 640, it is assumed that magnetic anomaly sensing system has detected a target, has detected/discriminated/measured components of a total magnetic field B emanating from the target, and has generated (or provided the raw data for such generation) magnetic anomaly field magnitude data, gradient tensor data and an associated gradient contraction scalar. Next, at step 642, the tracking system uses one or both of the present invention's magnetic anomaly magnitude-based STAR methods (i.e., the DD and/or the LSF method) to calculate a first approximation of target position and target magnetic moment which will deviate slightly from the true values thereof owing to the aforementioned asphericity errors. Accordingly, with reference to FIG. 2B, step 642 essentially calculates r' and M' using the present invention's DD method and/or LSF method. Then, using the well known magnetic field "dipole approximation"

$$B=(\mu/4\pi)[3(M \cdot r)r/r^5 - M/r^3],$$

and the resulting set of three independent equations corresponding to the vector components of B, $$B_X=(\mu/4\pi)[(3r_X^2-r^2)M_X+3r_Xr_YM_Y+3r_Xr_ZM_Z]r^{-5}$$

$$B_Y=(\mu/4\pi)[3r_Xr_YM_X+(3r_Y^2-r^2)M_Y+3r_Yr_ZM_Z]r^{-5}$$

$$B_Z=(\mu/4\pi)[3r_Xr_ZM_X+3r_Yr_ZM_Y+(3r_Z^2-r^2)M_Z]r^{-5}$$

step 644 calculates the components $B_X$, $B_Y$, $B_Z$ that would be produced by the components of r' and M' (i.e., $r_X'$, $r_Y'$, $r_Z'$; $M_X'$, $M_Y'$, $M_Z'$). Note that since the invention also calculates at least one gradient tensor (i.e., ∇B), the asphericity compensation method could also optionally include calculation of the tensor values (e.g., ∂Bx/∂x, ∂Bx/∂y, ... ∂By/∂z ... etc.) that would be produced by r' and M'. This option (not shown in FIG. 12) could be used to verify the results of the B-based asphericity compensation, and determine/discriminate the presence of multiple targets.

Step 646 uses the results from steps 640 and 644 to calculate the sum of the squares of the differences between measured and calculated B-vector-component values for both the r' and the M' parameters. The sums generated at step 646 are compared at step 648 to some predetermined tolerance parameters. Specifically, if the sums are greater than the tolerance parameters, the values for r' and M' are adjusted at step 650 and processing returns to step 644. Steps 648 and 650 are then repeated until the smallest sums (generated at step 646) are obtained with the resulting set of component values of position r and dipole moment M values representing the best fit to the measured data. The resulting set of component values is suitable for output (e.g., more processing, display, etc.) at step 652.

In its simplest form, the present invention can be used to just detect a magnetic target. However, in most practical applications, the above-described location and classification determination aspects of the present invention would also be utilized. Still further, the present invention can be used to track a moving magnetic target in accordance with the following description. Again referring to FIGS. 4 and 5, the output of the magnetic sensor array is provided to processing system 20. The term "output" here can mean the magnetic anomaly field components, associated magnetic anomaly scalar magnitudes and the gradient components and associated gradient contraction scalar(s) developed by the sensing system as described above. However, the output of the sensing system could also be raw TM sensor data in which case processing system 20 would be equipped to generate the magnetic gradient tensors and associated gradient contraction scalars. In either case, processing system 20 continuously (e.g., at intervals of 0.1-1 seconds) generates magnetic anomaly field and magnetic gradient data. The magnetic anomaly field data (i.e., the magnetic anomaly field vectors, magnetic anomaly field magnitudes, one or more gradient tensors and associated gradient contraction scalars) can be used to (i) calibrate the sensor system, (ii) detect the target, and (ii) determine target range, velocity, acceleration and magnetic moment signature.

Figure 13:
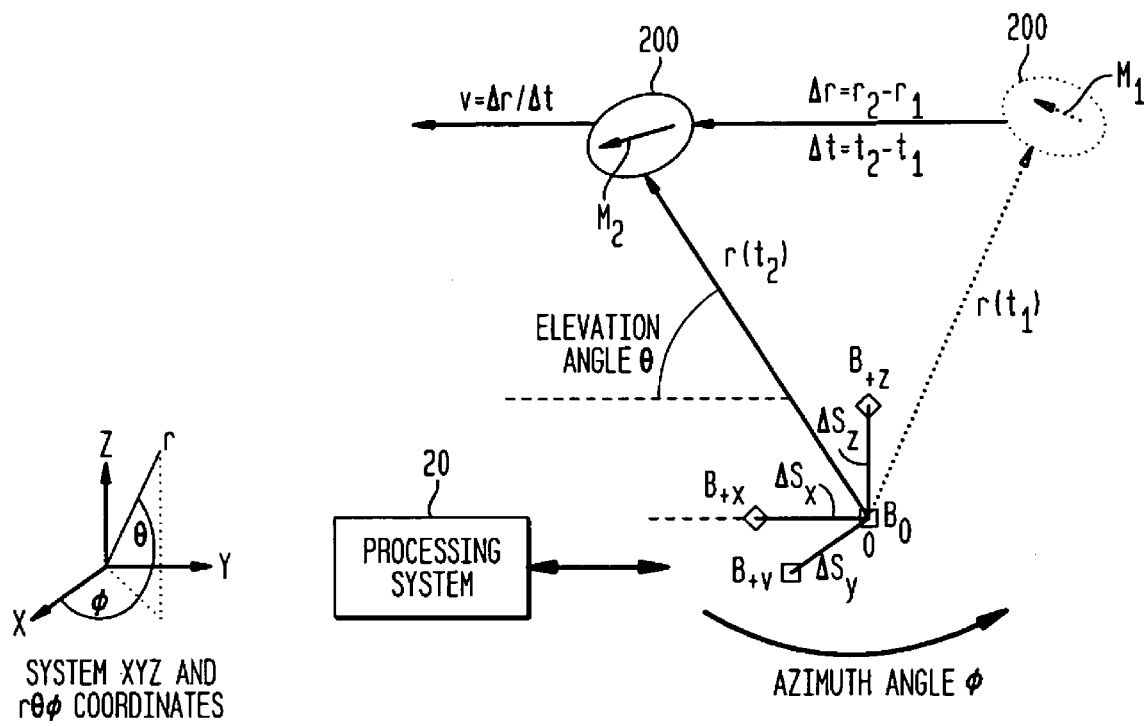
FIG. 13 is a graphic view of the $B_I$-parameters and triangulation baselines when the present invention is employed in a target-tracking mode.

The tracking aspects of the present invention will be described with reference to the example illustrated in FIG. 13. In this illustration, processing system 20 uses the magnetic anomaly field magnitudes at a time (e.g., $t_1$) when the target has been detected and the tracking system is locked onto the target. At this point, bearing, elevation and range "r" to the target, and the target's vector magnetic dipole signature "M" are determined (i.e., $r_1$ and $M_1$) at time $t_1$. Target detection as well as bearing, elevation, range and magnetic signature determination using the B-STAR sensing system is described above in detail.

The range, bearing, elevation and magnetic signature are next determined at a second time $t_2$ when target 200 has moved some distance such that a second range $r_2$ and a second measurement of magnetic signature $M_2$ are determined. The changes in range (i.e., $r_2-r_1$) divided by the change in time (i.e., $t_2-t_1$) is indicative of the velocity $v_{1,2}$ of the target during the time interval between $t_1$ and $t_2$. The time-rate-of-change of the magnetic signature from time $t_1$ to $t_2$ is defined as $(M_2-M_1)/(t_2-t_1)$. This process can be repeated for consecutive target positions. The difference between consecutively determined velocities divided by the respective change in time is indicative of kinematic acceleration. The difference between consecutively determined magnetic signatures divided by the respective change in time is indicative of the time-derivative of the magnetic signature of the target. The present invention's ability to account for changing magnetic signatures allows it to be used to track and classify targets whose magnetic signature changes with target motion/orientation in the Earth's background field.

The origin of the system's Cartesian (XYZ) coordinates and spherical (rθφ) coordinates is located (for the simple tetrahedral array of FIG. 5) at point O or the right-angled vertex of the tetrahedral array of TM sensors. Here, the coordinates are defined so that the system's X, Y and Z-axes each contain one of the three orthogonal triangulation baselines of the array and a corresponding set of $B_I$ parameters.

As explained above, the present invention uses the $B_r$-parameters to detect, lock onto, track and classify a moving magnetic target. While tracking, the system's processor develops data corresponding to the target's elevation θ, relative bearing φ, range r, velocity v, acceleration a, and the XYZ-components of magnetic dipole moment M and ΔM/Δt, etc., as the means to classify the target and its state of rotational motion.

The present invention can also be used to control a remotely-located device in accordance with the approach disclosed in the '399 patent. Briefly, if a remote device and positioning assembly are located a distance D away from the magnetic anomaly tracking system, the tracking system determines primary target parameters $r_1$, $\Delta r_1/\Delta t$, $\Delta v/\Delta t$, $\theta_1$, $\phi_1$ and M at its location. Using simple trigonometric relations, the primary target parameters can be correlated with distance D to provide the respective target parameters ($r_2$, $\theta_2$ and $\phi_2$) at the location of the remote device and positioning assembly. A servo mechanism coupled to the tracking system and the remote device's positioning assembly uses the $r_2$, $\theta_2$ and $\phi_2$ parameters to aim the device at the target. In the event that the tracking system lost its lock on a target, the last measured values of range, bearing, velocity and acceleration would be used to predict new values of the respective target-tracking variables. A variety of well-known geometric/analytical prediction schemes could be used without departing from the scope of the present invention. Thus, the tracking system is a feedback-based system that will keep forward-pointing direction of the remote unit aligned with a moving target.

The advantages of the present invention are numerous. A unique method is presented for using magnetic anomaly field magnitudes in a longer-range STAR-type magnetic anomaly sensing system. The new magnetic anomaly magnitude based STAR system allows the improved tracking to be performed with simpler, more economical sensor system embodiments that also do not require a mechanical positioner assembly. The new methods include a unique B-field-based directional derivative method and a B-field-based least-squares-fit method that allow the tracking system to continually track a moving target while the tracking system itself remains completely stationary. The invention can also be used to physically aim a remote device at a target. A unique, B-based method is also presented for compensation of "asphericity errors" of STAR-type magnetic anomaly sensing systems by using STAR-derived data in a rapidly converging magnetic anomaly magnitude-based least-squares-fit approach.

Although the invention has been described relative to specific embodiments thereof, there are numerous variations and modifications that will be readily apparent to those skilled in the art in light of the above teachings. For example, more symmetrical sensor system embodiments, such as a six-TM octahedral array or an eight TM sensor cubic array could be used to provide a capability for simultaneous determination of spatially symmetric sets of B-parameters and gradient contraction ($C_T$) parameters. The more symmetrical sensor system embodiments would provide a significantly improved capability for tracking multiple targets. Furthermore, a networked arrangement of a plurality of spatially separate tracking systems of the present invention could be deployed over a wide region with the outputs from each tracking system being correlated at a master processor. This correlated wide-area application would provide enhanced detection, localization and classification (DLC) of magnetic targets. It is therefore to be understood that, within the scope of the appended claims, the invention may be practiced other than as specifically described.

What is claimed as new and desired to be secured by Letters Patent of the United States is:

1. A magnetic anomaly sensing system, comprising:
   at least four triaxial magnetometer (TM) sensors with each of said TM sensors having X,Y,Z magnetic sensing axes, said TM sensors arranged in a three-dimensional array with respective ones of said X,Y,Z magnetic sensing axes being mutually parallel to one another in said three-dimensional array;
   said three-dimensional array defining a geometry that forms at least one single-axis gradiometer along each of said X,Y,Z magnetic sensing axes; and
   processing means coupled to each of said TM sensors for generating
   scalar magnitudes of a magnetic anomaly field measured at each of said TM sensors,
   comparisons of said scalar magnitudes to at least one threshold value,
   distance to a source of said magnetic anomaly field using said scalar magnitudes when said at least one threshold value is exceeded, and
   a magnetic dipole moment of said source using said distance.

2. A magnetic anomaly sensing system as in claim 1 wherein said TM sensors comprise four TM sensors arranged at vertices of a right-angle tetrahedron.

3. A magnetic anomaly sensing system as in claim 2 wherein said tetrahedron is an isosceles tetrahedron.

4. A magnetic anomaly sensing system as in claim 1 further comprising at least one output device coupled to said processing means for processing data indicative of said distance and said magnetic dipole moment.

5. A magnetic anomaly sensing system as in claim 4 wherein said output device processes said data for presentation in a human-discernable format.

6. A magnetic anomaly sensing system as in claim 4 wherein said output device processes said data for presentation in a computer-discernable format.

7. A magnetic anomaly sensing system as in claim 1, said processing means further
   generating a total gradient contraction for said three-dimensional array, and
   comparing said total gradient contraction to a contraction threshold value, wherein said distance and said magnetic dipole moment are generated only when said contraction threshold is exceeded.

8. A magnetic anomaly sensing system as in claim 2 wherein said processing means generates said distance and said magnetic dipole moment by
   processing, in accordance with a magnetic scalar triangulation and ranging (STAR) processing scheme, said scalar magnitudes and baseline distances defined by each of said single-axis gradiometers to determine a directional derivative associated with said scalar magnitudes,
   calculating a unit vector using said directional derivative,
   determining a projection distance from each of said vertices to said source wherein each said projection distance is a function of said unit vector and one of said baseline distances, and
   processing each said projection distance in accordance with said STAR processing scheme to determine said position and said magnetic dipole moment.

9. A magnetic anomaly sensing system as in claim 2 wherein said processing means generates said distance and said magnetic dipole moment by processing said scalar magnitudes to determine a least squares fit to the relationship $$(\mu/4\pi)kMr_I^{-3}$$

where
- $\mu$ is the magnetic permeability of an environment surrounding said source,
- k is an asphericity constant characterizing variance of said scalar magnitudes from true spherical symmetry,
- M is said magnetic dipole moment of said source, and
- $r_I$ is said projection distance from an I-th one of said vertices to said source, wherein least squares fit values of said projection distances $r_I$ along a baseline defined by each said single-axis gradiometer are defined, and processing said least squares fit values in accordance with a magnetic scalar triangulation and ranging (STAR) processing scheme to determine said position and said magnetic dipole moment.

10. A magnetic anomaly sensing system as in claim 1 wherein, while generating said scalar magnitudes, said processing means applies a compensation routine to zero-out effects of the Earth's magnetic field on said scalar magnitudes.

11. A magnetic anomaly sensing system as in claim 1 wherein, while generating said scalar magnitudes, said processing means applies a compensation routine to zero-out effects of variances in magnetic anomaly field-sensing capabilities of said TM sensors.

12. A magnetic anomaly sensing system as in claim 1, wherein said processing means further applies an asphericity compensation routine to said distance and said magnetic dipole moment, said asphericity compensation routine iteratively adjusting said position and said magnetic dipole moment using said scalar magnitudes until a position so-adjusted and a magnetic dipole moment so-adjusted are defined that form a best fit to a magnetic field dipole approximation relationship.

13. A method of detecting, localizing and classifying magnetic objects, comprising the steps of
   providing at least four triaxial magnetometer (TM) sensors with each of said TM sensors having X,Y,Z magnetic sensing axes, said TM sensors arranged in a three-dimensional array with respective ones of said X,Y,Z magnetic sensing axes being mutually parallel to one another in said three-dimensional array, said three-dimensional array defining a geometry that forms at least one single-axis gradiometer along each of said X,Y,Z magnetic sensing axes;
   generating scalar magnitudes of a magnetic anomaly field measured at each of said TM sensors;
   comparing said scalar magnitudes to at least one threshold value;
   determining distance to a source of said magnetic anomaly field using said scalar magnitudes when said at least one threshold value is exceeded; and
   determining a magnetic dipole moment of said source using said distance.

14. A method according to claim 13, wherein said TM sensors comprise four TM sensors arranged at vertices of a right-angle tetrahedron.

15. A method according to claim 14, wherein said tetrahedron is an isosceles tetrahedron.

16. A method according to claim 13, further comprising the step of processing data indicative of said distance and said magnetic dipole moment for presentation in a human-discernable format.

17. A method according to claim 13, further comprising the step of processing data indicative of said distance and said magnetic dipole moment for presentation in a computer-discernable format.

18. A method according to claim 13, further comprising the steps of:
   generating a total gradient contraction for said three-dimensional array; and
   comparing said total gradient contraction to a contraction threshold value, wherein said distance and said magnetic dipole moment are generated only when said contraction threshold is exceeded.

19. A method according to claim 14, wherein said steps of determining said distance and said magnetic dipole moment comprise the steps of:
   processing, in accordance with a magnetic scalar triangulation and ranging (STAR) processing scheme, said scalar magnitudes and baseline distances defined by each of said single-axis gradiometers to determine a directional derivative associated with said scalar magnitudes;
   calculating a unit vector using said directional derivative;
   determining a projection distance from each of said vertices to said source wherein each said projection distance is a function of said unit vector and one of said baseline distances; and
   processing each said projection distance in accordance with said STAR processing scheme to determine said position and said magnetic dipole moment.

20. A method according to claim 14, wherein said steps of determining said distance and said magnetic dipole moment comprise the steps of:
   processing said scalar magnitudes to determine a least squares fit to the relationship $$(\mu/4\pi)kMr_I^{-3}$$

where
- $\mu$ is the magnetic permeability of an environment surrounding said source,
- k is an asphericity constant characterizing variance of said scalar magnitudes from true spherical symmetry,
- M is said magnetic dipole moment of said source, and
- $r_I$ is said projection distance from an I-th one of said vertices to said source, wherein least squares fit values of said projection distances $r_I$ along baseline defined by each said single-axis gradiometer are defined; and processing said least squares fit values in accordance with a magnetic scalar triangulation and ranging (STAR) processing scheme to determine said position and said magnetic dipole moment.

21. A method according to claim 13, wherein said step of generating said scalar magnitudes includes the step of applying a compensation routine to zero-out effects of the Earth's magnetic field on said scalar magnitudes.

22. A method according to claim 13, wherein said step of generating said scalar magnitudes includes the step of applying a compensation routine to zero-out effects of variances in magnetic anomaly field-sensing capabilities of said TM sensors.

23. A method according to claim 13, further comprising the step of applying an asphericity compensation routine to said distance and said magnetic dipole moment, said asphericity compensation routine iteratively adjusting said position and said magnetic dipole moment using said scalar magnitudes until a position so-adjusted and a magnetic dipole moment so-adjusted are defined that form a best fit to a magnetic field dipole approximation relationship.

* * * * *